United States Patent [19]
Kasahara et al.

[11] Patent Number: 5,434,434
[45] Date of Patent: Jul. 18, 1995

[54] SEMICONDUCTOR OPTICAL DEVICE HAVING DEVICE REGIONS AND DIFFRACTION GRATINGS

[75] Inventors: Kenichi Kasahara; Shigeru Kawai, both of Tokyo, Japan

[73] Assignee: NEC Corporation, Japan

[21] Appl. No.: 29,460

[22] Filed: Mar. 11, 1993

[30] Foreign Application Priority Data

Mar. 12, 1992 [JP] Japan ................... 4-053888

[51] Int. Cl.6 ................... H01L 33/00; H01L 31/12; H01L 31/16
[52] U.S. Cl. ................... 257/84; 257/85; 257/95; 257/98; 257/432; 372/50; 372/48; 359/566
[58] Field of Search ................... 257/444, 83, 82, 84, 257/85, 98, 95, 432, 81, 80; 372/48, 50; 359/248, 261, 566, 569, 568

[56] References Cited

U.S. PATENT DOCUMENTS

| | | | |
|---|---|---|---|
| 3,951,513 | 4/1976 | Masi | 359/248 X |
| 4,872,176 | 10/1989 | Hammer | 257/80 X |
| 4,942,366 | 7/1990 | Toda | 359/566 X |
| 4,952,019 | 8/1990 | Evans et al. | 257/98 X |
| 5,019,787 | 5/1991 | Carlson et al. | 372/50 X |

OTHER PUBLICATIONS

McCormick et al., "Optomechanics of a Free-Space Photonic Switching Fabric: The System", SPIE International Symposium on Optical Applied Science & Engineering, SPIE Proceeding, vol. 1533, Paper 12, 1991, pp. 2–19.
Jahns et al., "Optical Interconnects Using Microlasers and Planar Optics", Conference Record of 1990 International Topical Meeting on Optical Computing, Apr. 8–12, 1990, Kobe, Japan, pp. 164–166.
Komatsu et al., "Polarization Independent GaAs/Al-GaAS Electro-Optic Guided-Wave Directional Coupler Switch Using (111)-Oriented GaAs Substrate," Photonic Switching Topical Meeting, 1991 Technical Digest Series, Mar. 6–8, 1991, Salt Lake City, Utah, pp. 193–194.

*Primary Examiner*—William Mintel
*Attorney, Agent, or Firm*—Laff, Whitesel, Conte & Saret

[57] ABSTRACT

A semiconductor optical device including multilayer semiconductor device regions formed on a surface of a semiconductor substrate which act as an optical device respectively, and diffraction gratings formed on a back of the substrate optically coupled with at least one of said regions through the substrate. The regions have a function such as light emitting, light receiving, light amplification or light switching. The regions and gratings can be respectively formed on the surface and the back, monolithicaly, and polishing of the substrate provides a suitable thickness so that the regions and the gratings may be optically coupled with each other. The regions and gratings may be arranged at the optimum positions in the direction parallel to the substrate. Extremely precise alignment of its components and many channels can be easily obtained with compact size.

29 Claims, 10 Drawing Sheets

SEMICONDUCTOR OPTICAL DEVICE HAVING DEVICE REGIONS AND DIFFRACTION GRATINGS

BACKGROUND OF THE INVENTION

1. Field of the Invention

The present invention relates to a semiconductor optical device having device regions and diffraction gratings and more particularly, to a semiconductor optical device having device regions on one side of a semiconductor substrate and diffraction gratings on the opposite side of the substrate, which can provide various functions such as optical switching and optical broadcasting.

2. Description of the Related Art

An optical switch has an advantage because it can realize faster switching (such a speed as Gbit/sec) than an electrical switch. Conventionally, directional coupler type optical switches made of dielectric material such as $LiNbO_3$ and a compound semiconductor such as AlGaAs and InGaAsP systems have been researched and developed. However, the conventional optical switches have a problem that the length thereof is too large and many channels cannot be provided.

Figure 1:
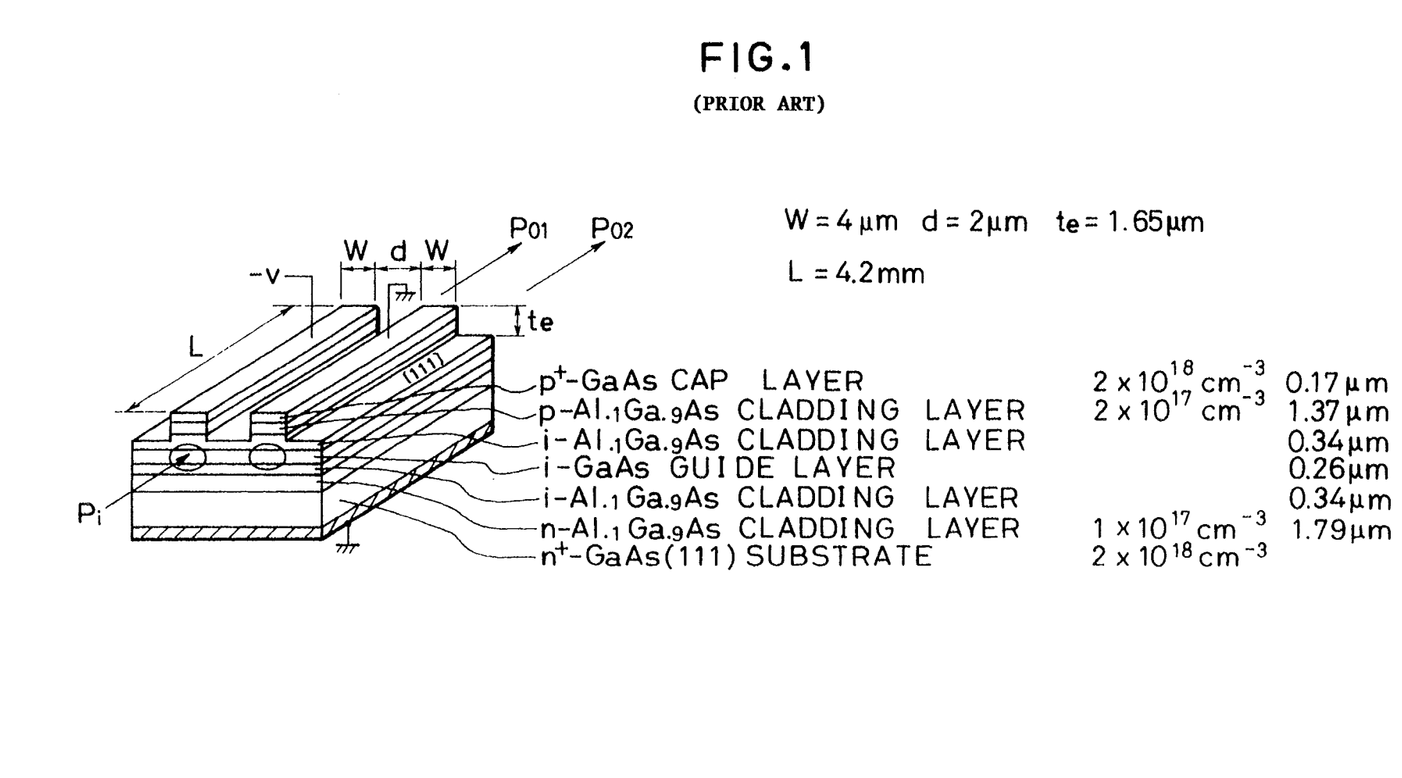
FIG. 1 is a perspective view of a conventional directional coupler type optical switch.

FIG. 1 shows a conventional directional coupler type optical switch, which is disclosed in the Digest of Photonic Switching Topical Meeting, Mar. 6-8, 1991, Salt Lake City, Utah, USA, pp. 193-196.

The switch shown in FIG. 1 has a length L of 4.2 mm. A 4×4 matrix switch system using these switches has been reported, however, the total length of the switch system becomes 15 to 20 mm, so that it is difficult to compose a large-scale optical switch array using the 100 to 1000 optical switches shown in FIG. 1. Besides, the difficulty of the large scale integration of the switches is due to one-dimensional (1 D) inputs thereof.

A directional coupler type optical switch generally has a problem that optical coupling is not easy and an optical loss is easy to occur. The switch shown in FIG. 1, which is not of a directional coupler type, has an optical waveguide (i-GaAs guide layer) in which light propagates. The cross-section thereof is rectangular whose thickness is 0.26 μm, so that the switch in FIG. 1 also has a problem that optical coupling is not easy to be done.

Figure 2:
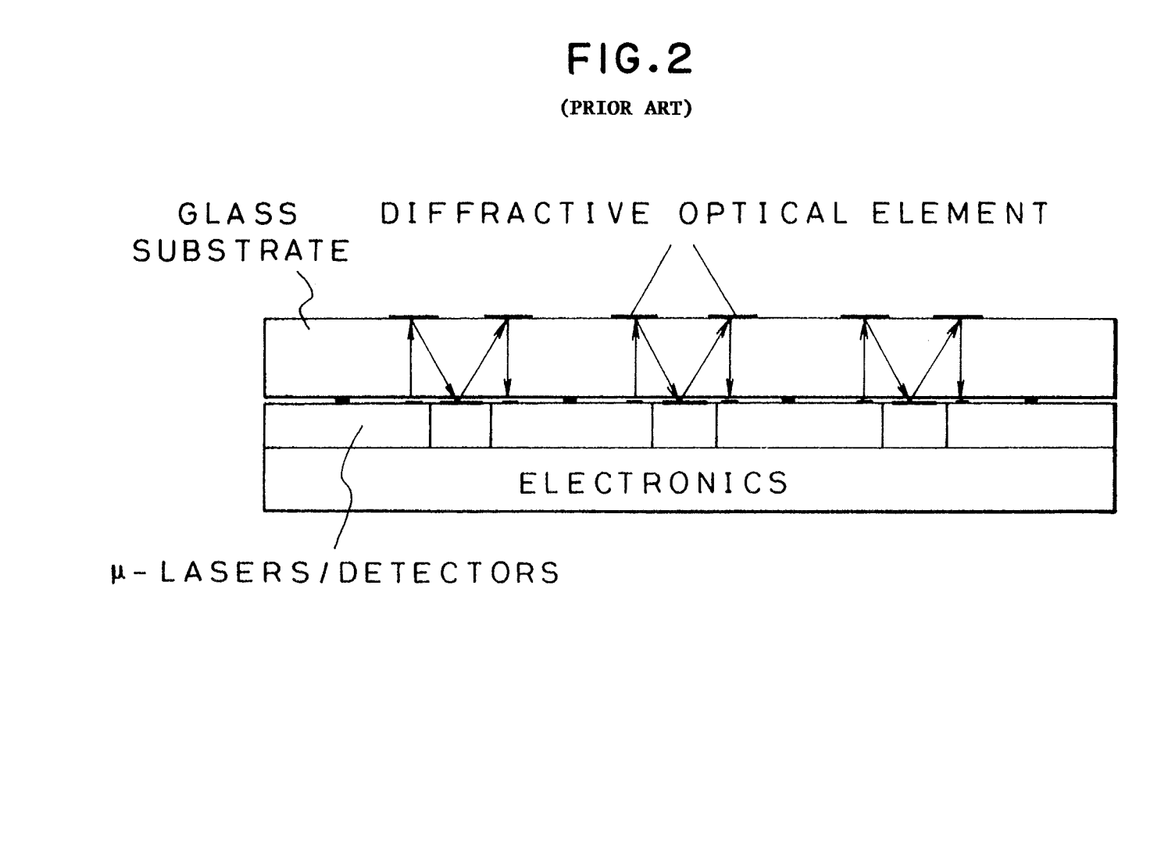
FIG. 2 is a cross-sectional view of a conventional semiconductor optical device.

Next, it has been expected that an optical device can realize a broadcast function, which means a function that one signal is distributed simultaneously to a plurality of devices or systems. A conventional semiconductor optical device which can realize the broadcast function is shown in FIG. 2. The device in FIG. 2 is disclosed in the Digest of International Topical Meeting on Optical Computing, Apr. 8-12, 1990, Kobe, JAPAN, pp 164-166.

The conventional optical device in FIG. 2 has diffraction gratings which act as a lens, a reflecting mirror, a beam splitter and the like on a substrate made of glass or quartz. In this device, light which has exited from a micro laser formed on the substrate enters in a planar optical circuit made of glass and is made curved by the gratings in the circuit and thereafter, enters in a light receiver formed on the substrate. In the device, a 1×1 optical coupling is made; however, if appropriate gratings are used, for example, the broadcast function can be realized.

The planar optical circuit shown in FIG. 2 has an advantage that the substrate having a large area is easy to be acquired and the substrate is transparent to light generally produced by semiconductor lasers of AlGaAs and InGaAsP systems. However, first, there is a problem that the planar optical circuit and the semiconductor optical device are required to be fabricated separately and joined to each other in alignment, which is not easy.

Second, there is another problem that processing of a glass or quartz plate with high precision and minuteness is difficult to be realized.

SUMMARY OF THE INVENTION

Accordingly, an object of the present invention is to provide a semiconductor optical device in which the above-mentioned problem relating to alignment of the components thereof can be solved.

Another object of the present invention is to easily provide a semiconductor optical device which can provide many channels with compact size.

Still another object of the present invention is to provide a semiconductor optical device which can provide a broadcast function with a simple structure.

The semiconductor optical device according to the present invention comprises semiconductor device regions formed on a first surface of a semiconductor substrate, which are of a multilayer structure and act as at least one optical device respectively, and diffraction gratings formed on a second surface of the substrate opposite to the first surface, which are optically coupled with the device regions through the substrate.

The respective device regions may act, for example, as a light emitter, a light receiver, a light modulator, or a light amplifier. The respective regions may also act one of a light switch, a memory, a light emitter, or a light amplifier, selectively.

With the semiconductor optical device according to the present invention, when the device regions are formed on the first surface of the substrate and the diffraction gratings are formed on the second surface of the substrate, monolithically, and the substrate is polished to have a suitable thickness, the device regions and the diffraction gratings can be optically coupled with each other. The regions and the gratings may be arranged at the optimum positions in the direction parallel to the substrate according to the processes that are used.

Therefore, the precision in alignment of the substrate, the devices and the gratings is determined by the precision of the lithography and polishing techniques. As a result, extremely precise alignment can be obtained and, it is not required that components of the semiconductor optical device are separately prepared and then are joined together in alignment.

Preferably, the thickness of the substrate is set so that light propagates in the substrate and then the device regions and the diffractive gratings are optically coupled with each other. The optical absorption coefficient of the substrate is preferably 100 $cm^{-1}$ or less.

Preferably, at least one diffractive grating is formed on the first surface of the substrate and is optically coupled with the gratings on the second surface. In this case, there arises an advantage that flexibility in device design can be increased.

In a preferred embodiment, the gratings on the second surface include a first grating having a light dividing function and a second grating having a light combining function. The first and second gratings are optically coupled with the device regions each having a light modulating function. A cross-state and a bar-state of an optical crossbar switch are selectively realized by the light modulating function.

In this case, the occupying area of the optical crossbar switch can be made smaller as compared with a directional coupler type optical switch, and the crossbar switches can be arranged in two-dimensions, so that a large number of channels can be provided. Besides, since the optical crossbar switch is easy to be optically coupled, optical coupling loss can be made smaller.

In another preferred embodiment, a light signal from the device region having a light emitting function is amplified and propagate in the substrate by the device region having a light amplifying function and the diffraction gratings, and then reaches the device region having a light receiving function. In this case, a broadcast function can be realized with simple structure.

Preferably, the device regions are bonded with a semiconductor chip having electronic circuits by the flip chip bonding technique. The broadcast function can be applied to the electronic circuits.

In a further preferred embodiment, the substrate includes an array of the diffraction gratings and an array of the device regions. Each of the gratings converges the light emitted from the substrate on a plane which is positioned outside of the substrate. Each of the device regions has a light emitting function. When the light signals from the array of the regions are converged to the external surface by the array of the gratings one by one in the outside of the substrate, the total occupation area of the external plane by the light signals is set so as to be larger than that of the substrate surface by the regions.

In this case, by means of one by one parallel optical interconnections can be realized with the difficulty relating to component-alignment being solvent.

Preferably, the substrate including the arrays of the diffraction gratings and the device regions is mounted on a semiconductor chip having electronic circuits by the flip chip bonding technique. The light signals converted from the electric signals in the electronic circuits are set so as to converge on the external plane through a free space external to the substrate and the chip. Since the light receiving areas of the external plane are so large that the light signals can be received safely even if the light signal beams fluctuate due to vibration or the like, the problem relating to the component-alignment doe not occur.

In a further preferred embodiment, a dielectric film serving as a light propagation layer is formed on the second surface of the substrate. Diffraction gratings are formed on the dielectric film and the thickness of the film is set so that the gratings on the films and on the substrate are optically coupled together. Flexibility in device design can be increased and a high performance semiconductor optical device can be obtained.

The light propagation layer is preferably formed by a film made of SiN, $SiO_2$ or $TiO_2$, or a composite film made of at least two of SiN, $SiO_2$ or $TiO_2$.

In a still further preferred embodiment, the substrate is of semi-insulating semiconductor. The device regions having a multilayer structure are formed by a p-type first distribution Bragg reflector (DBR) layer, a p-type first semiconductor layer, as n-type second semiconductor layer, a third semiconductor layer of low impurity concentration, a p-type fourth semiconductor layer, an n-type fifth semiconductor layer, and an n-type second DBR layer, which are laminated on the first surface of the substrate in the named order.

The third semiconductor layer includes an active layer of the same conductive type which serves also as a light absorption layer.

Each of the device regions has a function, such as light receiving and light modulating, and are composed of the n-type second semiconductor layer, the third semiconductor layer having low impurity concentration, the p-type fourth semiconductor layer, and the n-type fifth semiconductor layer.

Preferably, the impurity concentration of the third semiconductor layer is $1 \times 10^{16}$ cm$^{-3}$ or less. The band gap of the active semiconductor layer is set so as to be narrower than those of the adjacent semiconductor layers.

In this case, if the multilayer structure is formed on the substrate by one crystal growth process, the device regions can be obtained, each of which has a function such as a light emitting, a light receiving, a light modulating and a light amplifying one, and which have a set of functions of light switching, memory, light emitting and light amplifying.

If the device region having a light receiving function is used as a bipolar transistor, electronic circuits can be incorporated into the semiconductor optical device.

BRIEF DESCRIPTION OF THE DRAWINGS

FIGS. 5A to 5C are views showing a semiconductor optical device according to a third embodiment of the present invention, in which

DESCRIPTION OF THE PREFERRED EMBODIMENTS

Preferred embodiments of the present invention will be described below while referring to the drawings attached.

[First Embodiment]

Figure 3:
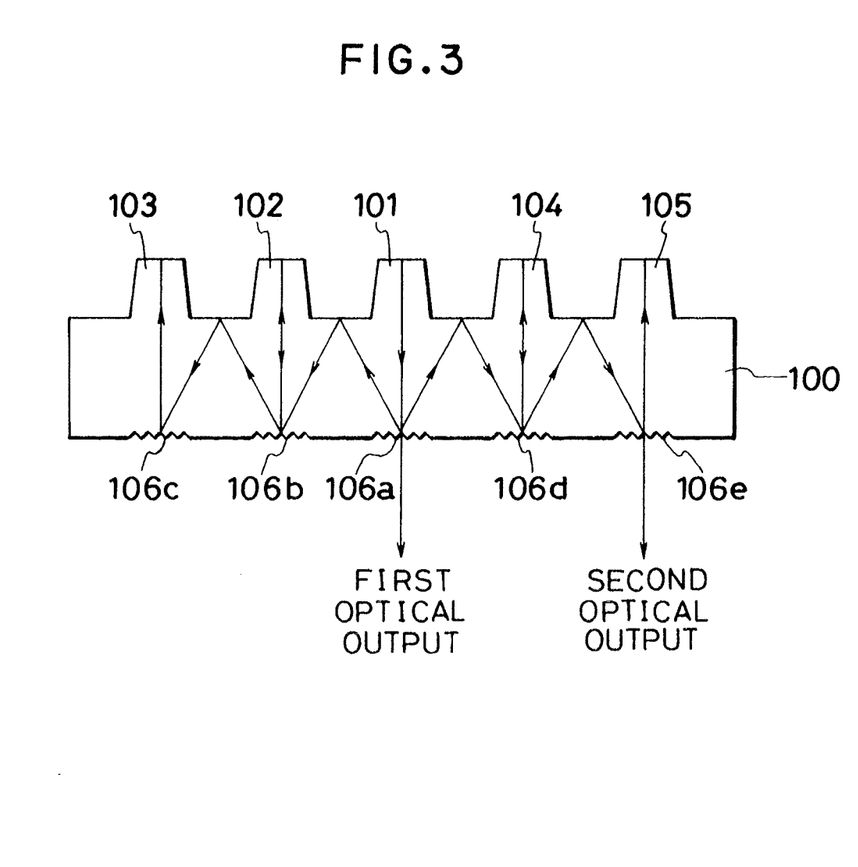
FIG. 3 is a schematic cross-sectional view of a semiconductor optical device according to a first embodiment of the present invention.

FIG. 3 schematically shows a semiconductor optical device according to a first embodiment of the present invention.

In FIG. 3, a light emitter region 101, a light modulator region 102, a light receiver region 103, a light amplifier region 104 and a multifunction region 105 having light receiver, memory, light emitter and light amplifier functions are formed on a surface of a semiconductor substrate 100. The regions 101, 102, 103, 104 and 105 respectively have a semiconductor multilayer structure and are disposed at regular intervals on the surface of the substrate. Diffraction ratings 106a, 106b 106c, 106d and 106e are formed on a back of the substrate 100 at regular intervals and respectively disposed just below the regions 101, 102, 103, 104 and 105.

Figure 9:
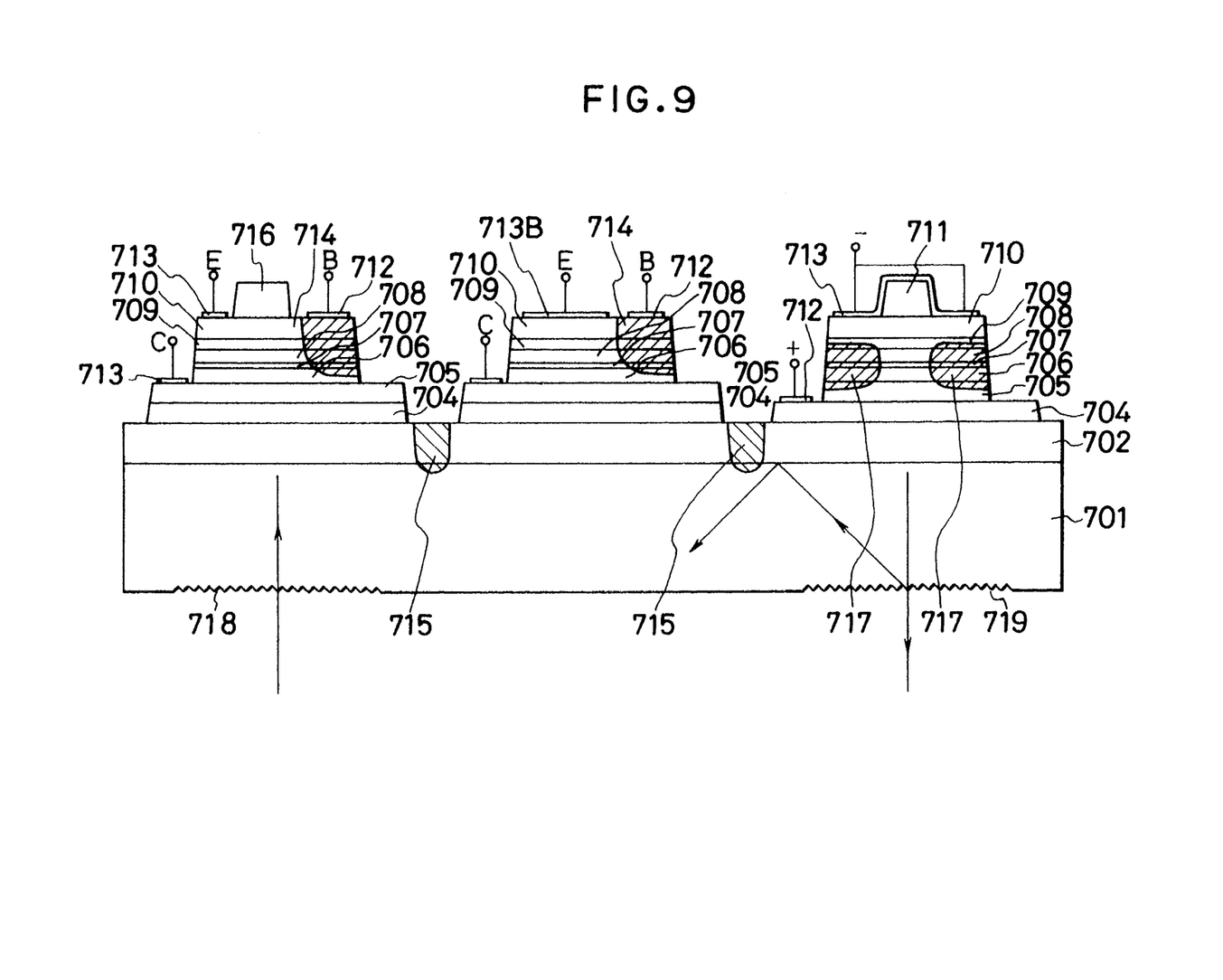
FIG. 9 is a schematic cross-sectional view of a semiconductor optical device according to a seventh embodiment of the present invention.

The concrete structures of the regions 101, 102, 103, 104 and 105 are described in detail in a following seventh embodiment with referring to FIG. 9.

The fabrication process of the semiconductor optical device above-described is as follows:

First, a semiconductor multilayer film is formed on the surface of the substrate 100 by the crystal growth technique and then, the light emitter region 101, the light modulator region 102, the light receiver region 103, the light amplifier region 104 and the multifunction region 105 are formed in the multilayer film.

Subsequently, the back of the substrate 100 is polished and the thickness of the substrate 100 is set for a predetermined value. The gratings 106a, 106b 106c, 106d and 106e are formed by the etching technique on the back of the substrate 100 after positional adjustment to the regions 101, 102, 103, 104 and 105 is finished using the both-sided exposure technique. Thus the device shown in FIG. 3 is obtained.

In the device, laser light is emitted from the light emitting region 101 in a lower direction perpendicular to the substrate 100. The laser light passes through the inside of the substrate 100 and a part thereof exits from the substrate 100 as a first optical output from the grating 106a. The remainder of the laser light propagates in the substrate 100 in a direction parallel to the substrate 100 while being reflected by the surface and back of the substrate 100 and diffracted by the grating 106b, 106c, 106d and 106e in a zigzag pattern.

In FIG. 3, the diffracted light beam propagating to the left side in the substrate 100 is optically coupled with the light modulator region 102 by the grating 106b and intensity-modulated by the region 102. The modulated beam is diffracted again by the grating 106b and then propagates in a zigzag pattern to the left side in the substrate 100. Next, the light beam enters the light receiver region 103 after being diffracted by the grating 106c and then detected by the region 103.

Similarly, the diffracted light beam propagating to the right side in the substrate 100 is optically coupled with the light amplifier region 104 by the grating 106d and amplified by the region 104. The amplified light beam is diffracted again by the grating 106d and propagates in a zigzag pattern to the right side in the substrate 100. The light beam enters the multifunction region 105 after being diffracted by the grating 106e.

The multifunction region 105 has electric ON- and OFF-states as a thyristor. Laser light is generated and emitted in the ON-state when a supply current is larger than a certain level (light switching and light emitting functions). If the region 105 is maintained in a OFF-state before laser light from the light emitter region 101 enters, the region 105 is switched to the ON-state when the laser light enters. The ON-state thus switched is maintained even if the laser light stops entering the region 105 (a memory function). When desired, a current larger than the threshold is supplied to the region 105 to make it emit laser light.

If a bias current near the threshold is applied to the multifunction region 105 in ON-state, the region 105 serves as a light amplifier.

A part of the light entered the grating 106e just below the region 105 exits from the substrate 100 as a second optical output.

The substrate 100 is required to be transparent because light propagates therein; however, it is impossible to avoid an optical loss due to free-carrier absorption and/or impurity absorption. If optical absorption coefficient of the substrate 100 is 100 cm$^{-1}$ or less, the optical loss is covered by a light amplifier disposed in the light path.

The process of polishing the substrate 100 is performed similar to that of a semiconductor laser for its cleavage.

A fundamental function of a different grating is a lens function. Therefore, as an example, in case that the grating 106a just below the light emitting region 101 has a lens function, a necessary precision of the thickness of the substrate 100 will be described below.

A radius Rn of an Nth fringe of a zone plate having a concentric-circle pattern is expressed by $$Rn = (2N\lambda f/n)^{\frac{1}{2}}$$

where $\lambda$ is a wavelength of light in the atmosphere, f is a focal length of the grating 106a in the atmosphere and n is a refractive index of the substrate 100.

In case the substrate 100 is made of GaAs and a wavelength of the laser light emitted from the light emitter region 101 is 950 nm, n is 3.53.

The region 101 can be obtained by InGaAs light emitting layer made by slightly doped GaAs with In for making the laser wavelength longer, as shown in the following seventh embodiment.

With the relation between a numerical aperture (NA) and a minimum fringe pitch of the zone plate, if NA=0.2, the minimum pitch is 1.4 μm and if NA=0.3, the minimum pitch is 0.3 μm.

Using a distance t between a light emitting point of the light emitter region 101 and the back of the substrate 100, a focal distance a of a primary diffracted light which exits from the substrate 100 to the atmosphere is expressed as $$a = \{(ft)/n(t-f)\}.$$

Tolerance or precision relating the thickness of the substrate 100 can be calculated from the equation. In order that the light may propagate to a point which is 10 mm distant from the back of the substrate 100, 1 μm precision of the thickness of the substrate 100 is required in case of a=100 μm, and 5 μm precision thereof is required in case of a=300 μm.

As a test, a zone plate was formed from a 6 mm×8 mm semiconductor wafer and its surface was polished to obtain a thickness of 123 μm. When the thickness of the zone plate or substrate 100 was measured, 122 μm was obtained at only one measuring point and 123 μm at all other measuring points. Thus, it was found that the thickness of the substrate 100 could be controlled strictly with a very high precision of 1 μm.

In addition, since the substrate 100 may be polished to be like a mirror using a commercial diamond paste as a last step of the polishing process, the precision of the thickness thereof can be further improved.

The diffraction gratings 106a, 106b, 106c, 106d and 106e were formed on the back of the substrate 100 by the etching technique using a etching solution with a 3:3:50 ratio of $H_3PO_4:H_2O_2:H_2O$. The etching depth of the gratings were 0.19 μm in 110 seconds.

The depth of the gratings can be controlled with a precision of 10 nm in using the wet etching technique; however, it can be controlled with precision of 10 nm or lower in using the dry etching technique, which has an effect on diffraction efficiency.

By the above-described process, the region 101, 102, 103, 104 and 105 were formed on the surface of the substrate 100 having a thickness of 100 μm at regular intervals of 250 μm. Each of the diffraction gratings 106a, 106b, 106c, 106d and 106e has a diameter of 100 μm and a depth of 0.19 μm were formed on the back of the substrate 100 at the same intervals. It was confirmed that the semiconductor optical device thus obtained was able to realize the above-mentioned functions.

With the optical device shown in FIG. 3, the respective device regions 101, 102, 103, 104 and 105 may be formed on the surface of the substrate 100 and the gratings 106a, 106b, 106c, 106d and 106e may be formed on the back of the substrate 100, monolithically. Further, the positional relation between the regions 101, 102, 103, 104 and 105 and the gratings 106a, 106b, 106c, 106d and 106e in a direction parallel to the substrate 100 may be set optimum according to processes used. In addition, the substrate 100 is polished to set its thickness at an optimum value to thereby optically couple the regions 101, 102, 103, 104 and 105 and the gratings 106a, 106b, 106c, 106d and 106e with each other.

Therefore, the alignment of the regions and gratings is determined by the precision of the lithography and polishing techniques, so that it can be set very strictly. As a result, no process of joining device components separately fabricated with each other is required.

[Second Embodiment]

Figure 4:
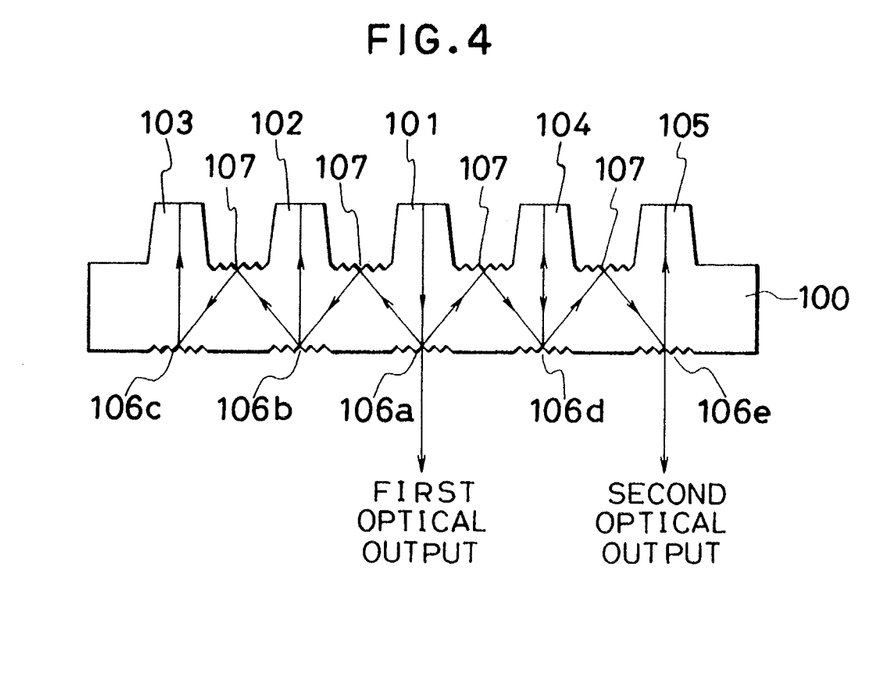
FIG. 4 is a schematic cross-sectional view of a semiconductor optical device according to a second embodiment of the present invention.

FIG. 4 shows a semiconductor optical device according to a second embodiment of the present invention. The device of this embodiment has the same structure as that of the first embodiment other than that four diffraction gratings 107 are formed on the surface of the substrate 100. The respective gratings 107 are disposed at the spaces between the adjacent regions.

In the device of the first embodiment, the thickness of the substrate 100 is set so that laser light may be totally-reflected by the surface and back of the substrate 100; however, such a suitable thickness of the substrate 100 cannot be adopted at all times. In the device of this embodiment, since there are provided with the gratings 107, an advantage of increased flexibility in device design can be obtained.

[Third Embodiment]

Figure 5A:
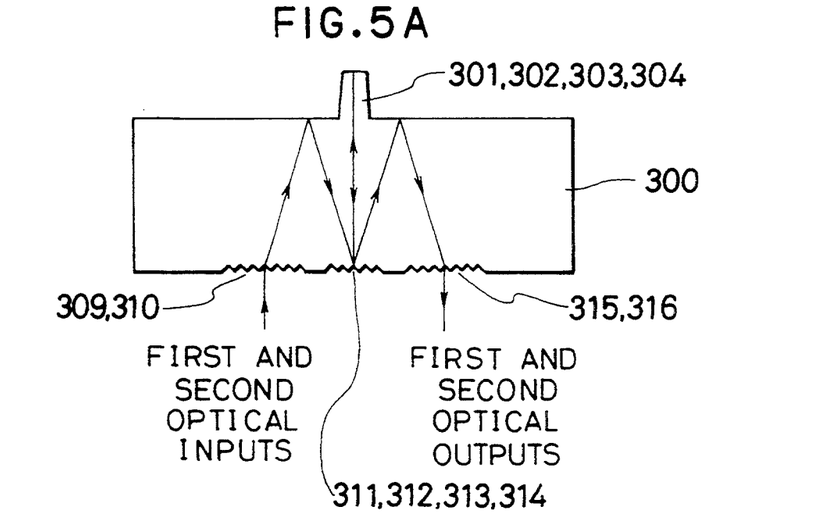
FIG. 5A is a schematic cross-section.
Figure 5B:
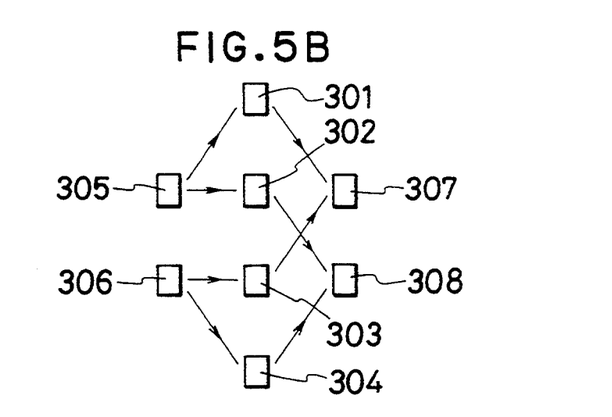
FIG. 5B is a plan layout diagram.
Figure 5C:
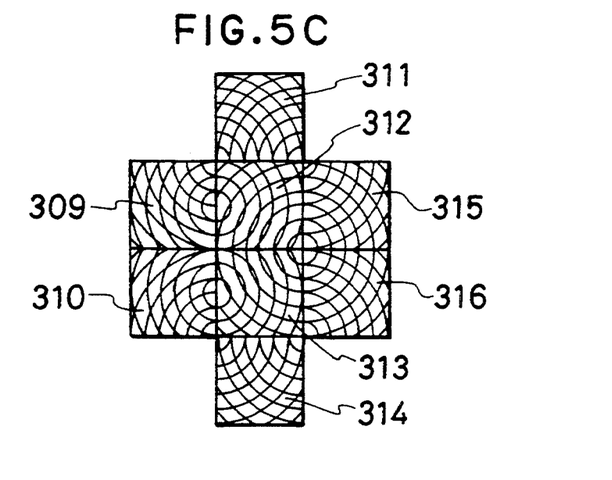
FIG. 5C is schematic pattern diagrams of diffraction gratings.

FIGS. 5A to 5C show a semiconductor optical device according to a third embodiment of the present invention, which is a 2×2 optical crossbar switch.

On a surface of a semiconductor substrate 300, four light modulator regions 301, 302, 303 and 304 are formed at regular intervals according to a layout shown in FIG. 5B. On a back of the substrate 100, a first input window 305, a second input window 306, a first output window 307 and a second output window 308 are formed at intervals according to a layout shown in FIG. 5B, and eight diffraction gratings 309, 310, 311, 312, 313, 314, 315 and 316 are formed according to a layout shown in FIGS. 5A and 5C.

A first input light enters the inside of the substrate 300 through the first input window 305. The first input window 305 is disposed in the grating 309 and formed by etching superposed zone plates. The grating 309 has a function of dividing the first input light into two branches. The branches of the first light propagate to the gratings 311 and 312, respectively.

A second input light enters the inside of the substrate 300 through the second input window 306. The second input window 306 is disposed in the grating 310 and formed by etching superposed zone plates. The grating 310 has a function of dividing the second input light into two branches. The branches of the light propagate to the gratings 313 and 314, respectively.

The gratings 311, 312, 313 and 314 are disposed just below the light modulator regions 301, 302, 303 and 304, respectively.

The grating 311 has a function of sending the light diffracted by the grating 309 to the region 301 and sending the light modulated by the region 301 to the grating 315.

The grating 312 has a function of sending the light diffracted by the grating 309 to the region 302 and sending the light modulated by the region 302 to the grating 315.

The grating 315 has a function of combining the branches of the light through the regions 301 and 302.

The grating 313 has a function of sending the light diffracted by the grating 310 to the region 303 and sending the light modulated by the region 303 to the grating 316.

The grating 314 has a function of sending the light diffracted by the grating 310 to the region 304 and sending the light modulated by the region 304 to the grating 316.

The grating 316 has a function of combining the branches of the lights through the regions 303 and 304.

The first input light is optically coupled with the light modulator regions 301 and 302, and the second input light is optically coupled with the light modulator regions 303 and 304. The branches of the light modulated by the regions 301, 302, 303 and 304 respectively propagate toward the first output window 307 and the second output window 308, as shown in FIG. 5B, and are combined with each other by the gratings 315 and 316, respectively, and thereafter are emitted from the respective windows 307 and 308 as a first output and a second output.

If the branches of the light entering the regions 301 and 304 pass through the regions 301 and 304 without weakening and the branches of the light entering the regions 302 and 303 pass through the regions 302 and 303 with weakening, a "bar-state", that is, a state that the two branches of the light pass in parallel, of the crossbar switch can be realized.

If the branches of the light entered to the regions 302 and 303 passed through the regions 302 and 303 without weakening and the branches of the light entered to the regions 301 and 304 passed through the regions 301 and 304 with weakening, a "cross-state", that is, a state that the two branches of the light cross each other, of the crossbar switch can be realized.

Thus, in the third embodiment, a 2×2 optical crossbar switch can be obtained.

If a large number of the crossbar switches of this embodiments are fabricated on a semiconductor substrate as a set of switches, one stage of a multistage optical switching network can be obtained.

Microoptics for crossover interconnection is reported by F. B. McCormick et al. in SPIE International Symposium on "Optical Applied Science & Engineering", SPIE Proceedings, vol. 1533, pp 12, 1991. Such microoptics will realize a multistage optical switching network including two-dimensional optical switches in respective stages.

In case that a multistage switching network is formed electrically, only one-dimensional electrical switches may be arranged in respective stages. However, the optical switch of this embodiment will realize a high-speed and multichannel operation.

In the third embodiment, the light modulator regions 301, 302, 303 and 304 are disposed at 250 μm intervals; however, the intervals can be 100 μm or less.

The concrete structure of the regions 301, 302, 303 and 304 are described in the following seventh embodiment. Here, the respective regions 301, 302, 303 and 304 constitute npn heterojunction phototransistors. If a voltage is supplied between an emitter and a collector of the phototransistor, a voltage applied to an InGaAs layer varies and there is an optical absorption of an amount of the region changes according to the voltage applied, so that intensity of incident light will be modulated due to the Franz-Keldish effect.

In the optical switch of the embodiment, a high-speed light intensity modulation in the order of Gbit/sec, which is difficult by an electrical switch, can be realized. The size of the regions 301, 302, 303 and 304 is 30 μm×30 μm, which is much smaller than that of the conventional directional coupler type optical switch shown in FIG. 1. Besides, since optical coupling of the optical switch is easier to be done than that of the conventional directional coupler type optical switch, the coupling loss thereof can be reduced.

In the third embodiment, the light modulator regions 301, 302, 303 and 304 are provided at nodes; however, light amplifier regions may be provided in place of the regions 301, 302, 303 and 304.

[Fourth Embodiment]

Figure 6:
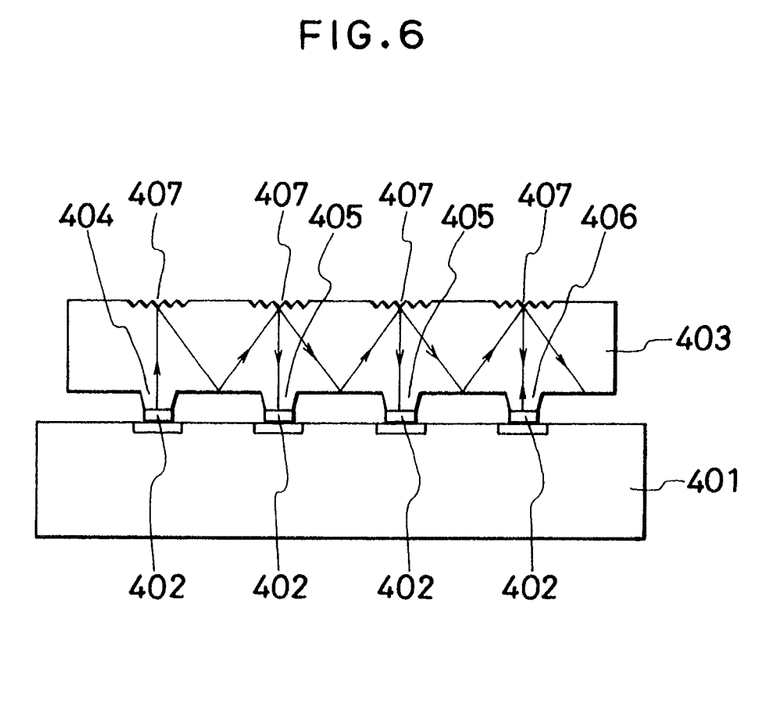
FIG. 6 is a schematic cross-sectional view of a semiconductor optical device according to a fourth embodiment of the present invention.

FIG. 6 shows a semiconductor optical device of a fourth embodiment of the present invention, which comprises a semiconductor substrate 403 and a semiconductor chip 401.

A light emitter region 404, two light receiver regions 405 and a light amplifier region 406 are formed on a surface (a lower face in FIG. 6) of the semiconductor substrate 403 at regular intervals. Four diffraction gratings 407 are formed on a back (an upper face in FIG. 6) of the substrate 403. The respective gratings 407 are disposed just above the respective regions 404, 405 and 406.

The substrate 403 is bonded on the chip 401 at the end faces of the regions 404, 405 and 406 through solder bumps 402 by the flip chip bonding technique. The respective bumps 402 have 10 μm×10 μm square cross-sections and 30 μm heights.

The chip 401 constitutes here an integrated circuit (IC) of Si.

Electric signals sent from electronic circuits (not shown) on the chip 401, which are connected through the bumps 402 to the light emitter region 404, are broadcasted to the two light receiver regions 405. In the embodiment, since weakened optical signals are amplified by the light amplifier region 406, the optical signals can be broadcasted to a lot of further distant positions.

The light amplifier 406 is described in detail later in the seventh embodiment. Optical amplification degree of the region 406 was 15 dB when 0.98 times current as large as the threshold was biased and a signal light of 1 μW was inputted. The operation speed thereof was in the order of Gbit/sec or more.

In the optical device of the embodiment, the broadcast function, which is difficult to be obtained by only electric devices, can be realized with a simple structure.

In the embodiment, the light amplifier region 406 having single function is provided; however, there may be provided a multifunction region having several functions such as light switching, memory, light emitting, light amplification and the like. The light amplifier function may be selected therefrom.

[Fifth Embodiment]

Figure 7:
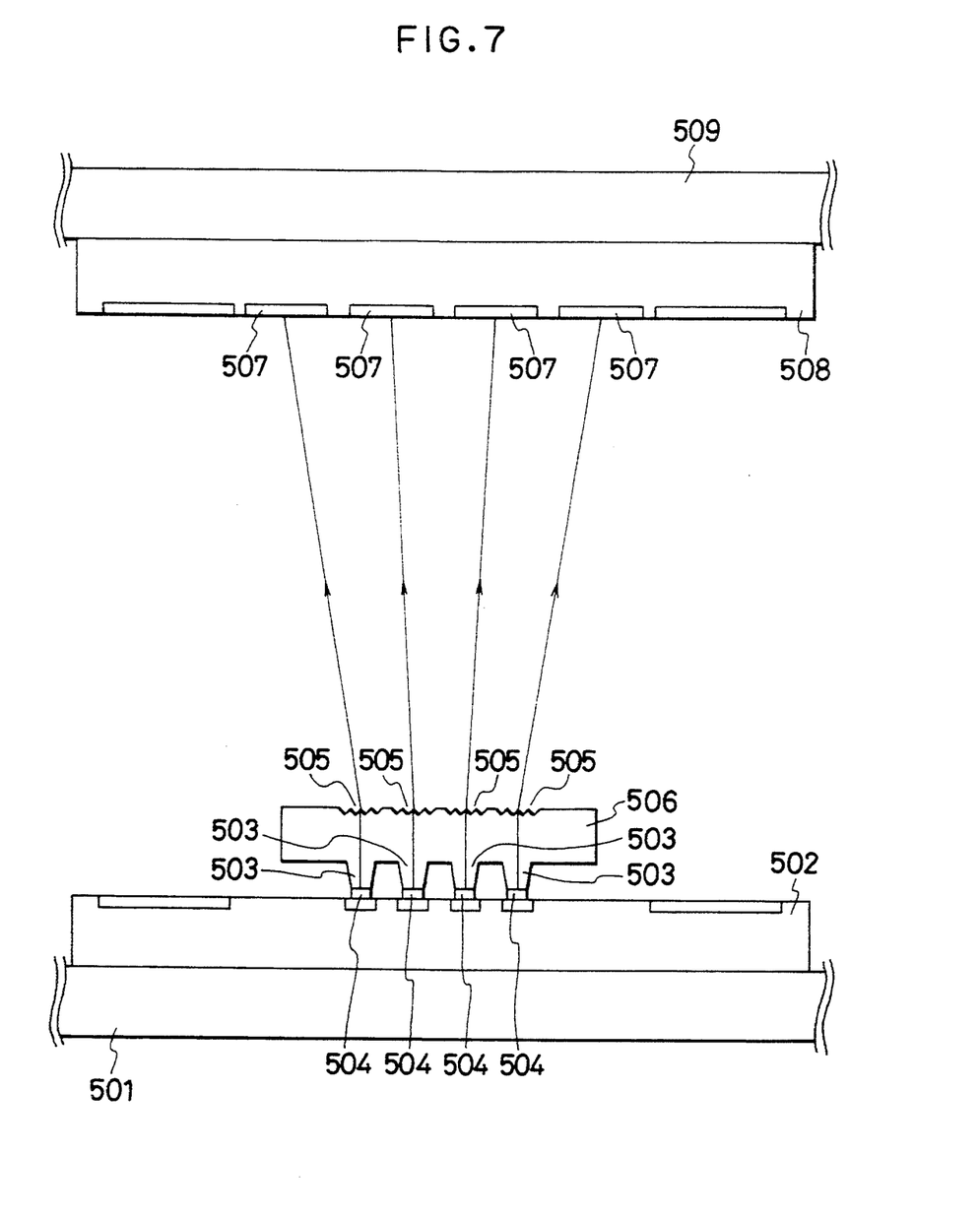
FIG. 7 is a schematic cross-sectional view of a semiconductor optical device according to a fifth embodiment of the present invention.

FIG. 7 shows a semiconductor optical device of a fifth embodiment of the present invention, which comprises a semiconductor chip 502 mounted on a first board 501, a semiconductor substrate 506 mounted on the chip 502 and a semiconductor chip 508 mounted on a second board 509. Here, the chip 502 constitutes an IC of Si.

To simplify the drawing, a package and the like are omitted in FIG. 7.

Four light emitter regions 503 are formed on a surface (a lower face in FIG. 7) of the substrate 506 at regular intervals, and four diffraction gratings 505 are formed on a back (an upper face in FIG. 7) of the substrate 506. The respective gratings 505 are disposed just above the respective regions 503.

The substrate 506 is mounted on the first board 501 at the end faces of the regions 503 through solder bumps 504 by the flip chip bonding technique. The substrate 506 has the same structure as that of the substrate 403 shown in FIG. 6.

The chip 508 on the second board 509 also constitutes an IC of Si, and a package and the like thereof are omitted in FIG. 7. Four light receiving regions 507 made of Si are formed on the surface (a lower face in FIG. 7) of the chip 508 at regular intervals.

When the light signals from the array of the light emitter regions 503 are converged to the surface of the chip 508 by the array of the gratings 505 one by one, the total occupation area of the surface of the chip 508 by the light signals is set so as to be larger than the total occupation area of the surface of the substrate 506 by the regions 503.

Therefore, the intervals between the focal points of the light signals on the surface of the chip 508 is larger than the intervals between the regions 503, so that the large-sized light receiver regions 507 can be arranged, as shown in FIG. 7. Thus, the light receiving areas of the chip 508 are so large that the light signals can be received safely even if the light signal beams fluctuate due to vibration or the like. As a result, the difficulty relating to the component-alignment can be solved.

An Si avalanche photodiode (APD) having a diameter of 1 cm and a response speed of 700 MHz have been on the market. However, light receiver regions 507 which do not utilize the avalanche amplification are formed on the chip 508 in the embodiment. The respective regions 507 have 500 μm in size and 1 Gbit/sec or more in response speed.

The semiconductor chips 502 and 508 have electronic circuits monolithically formed on the chips 502 and 508, respectively. The distance between the first board 501 and the second board 509 is (½) inch. Measurement precision of a frame (not shown) in which the boards 501 and 509 are inserted and fixed can be 100 μm or less, and the positional precision of the chips 502 and 508 mounted on the boards 501 and 509 respectively can be 100 μm or less.

In addition, since the semiconductor substrate 506 is mounted at a predetermined position by the flip chip bonding technique on the chip 502, an extremely high precision can be obtained due to its self-alignment effect. If a vibration-proof structure has the device according to the requirements, one by one parallel optical interconnections can be realized without difficulty relating component-alignment.

When electric wiring is done through back planes on adjacent boards for making a highly parallel computer system, the optical interconnection becomes a bottleneck. However, a problem that wiring lines are so many that the entire electric wiring cannot be done through the back planes on the adjacent boards can be avoided by such an optical interconnection utilizing a free space as that in the fifth embodiment.

[Sixth Embodiment]

Figure 8:
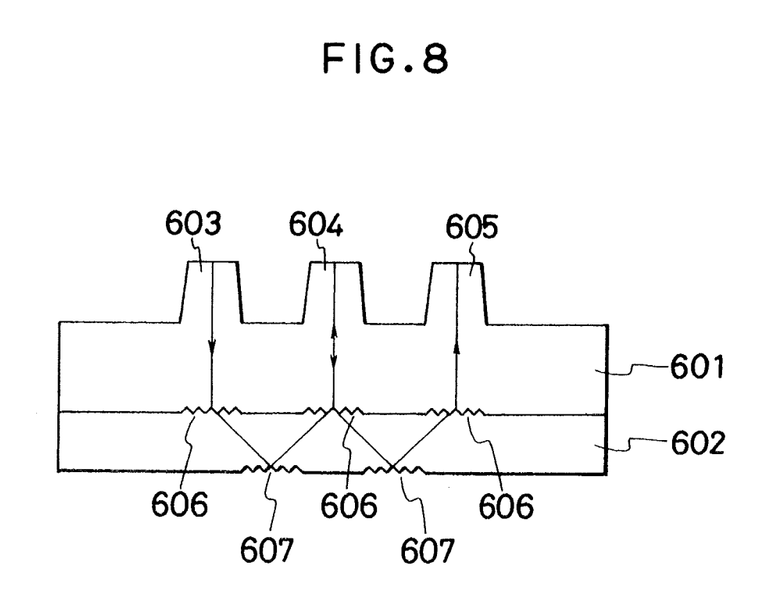
FIG. 8 is a schematic cross-sectional view of a semiconductor optical device according to a sixth embodiment of the present invention.

FIG. 8 shows a semiconductor optical device of a sixth embodiment of the present invention, which has an $SiO_2$ film 602 covering an entire back of a semiconductor substrate 601.

A light emitter region 603, a light modulator region 604 and a light receiver region 605 are formed on a surface of the substrate 601 at regular intervals. Three diffraction gratings 606 are formed on a back of the substrate 601. The respective gratings 606 are disposed just below the respective regions 603, 604 and 605.

Two diffraction gratings 607 are formed on the $SiO_2$ film 602 at an interval. The respective gratings 607 are disposed between three gratings 606. The $SiO_2$ film 602 serves as a light propagation layer.

Next, a fabrication process of the optical device is described below.

First, similar to the first embodiment in FIG. 3, the substrate 601 having the regions 604 and the gratings 606 is formed. Subsequently, the $SiO_2$ film 602 is formed on the back of the substrate 601 by the thermal chemical vapor deposition (CVD) technique and then the gratings 607 are formed on the film 602 by the etching technique.

The film 602 fills up concavities on the back of the substrate 601, so that the surface of the film 602 is approximately flat except the gratings 607.

The thickness of the film 602 is set so that the gratings 606 and 607 are optically coupled together. Since the thickness of the $SiO_2$ film 602 can be controlled in the order of several hundreds Å dependent on the deposition time, such a film 602 can be obtained easily.

In the embodiment, flexibility in device design can be increased and a high performance semiconductor optical device can be obtained.

[Seventh Embodiment]

FIG. 9 shows a semiconductor optical device of a seventh embodiment of the present invention. In FIG. 9, the structure of the device is shown in detail.

The concrete structures of the device regions and the substrates in the above first to sixth embodiments are the same as those in FIG. 9.

On a surface of a semi-insulating GaAs substrate 701, a plurality of semiconductor layers are laminatedly formed by the molecular beam epitaxy (MBE) technique. In FIG. 9, three device regions are formed on the substrate 701. The device region on the right side is a multifunction region like a PNPN device, which has functions of a light switch, memory, light emitter and light amplifier. The device region in the center acts as a heterojunction bipolar transistor (HBT), and the device region on the left side acts as a heterojunction phototransistor (HPT) which has functions of a light receiver and a light modulator.

The multifunction device region is formed by a semiconductor multilayer film having a PNPN structure, the device regions acting as an HBT and an HPT are formed by semiconductor multilayer films having NPN structures, respectively. The layers between the device regions are removed by the etching technique so as to form such configurations as shown in FIG. 9.

On the surface of the substrate 701, p-distributed Bragg reflector (DBR) layers 702 are formed, which are each composed of alternately laminated p-AlAs and p-GaAs layers (18.5 periods). The thickness of the respective layers 702 is ($\lambda/4$) ($\lambda$: in-medium wavelength of light) and the doping concentration thereof (p-dopant:Be) is $3 \times 10^{18}$ cm$^{-3}$.

P-GaAs/p-Al$_{0.4}$Ga$_{0.6}$As layers 704 are formed on the p-DBR layers 702. The total thickness of the respective layers 704 is approximately 150 nm, and the doping concentration is $5 \times 10^{18}$ cm$^{-3}$. The p-GaAs layer has a thickness of approximately 50 nm and act as a contact with an AuZn/Au film 712.

N-Al$_{0.25}$Ga$_{0.75}$As layers 705 are formed on the p-GaAs/p-Al$_{0.4}$Ga$_{0.6}$As layers 704. The thickness of the respective layer 705 is 300 nm. The doping concentration thereof (n-dopant:Si) is $2 \times 10^{17}$ cm$^{-3}$.

Non-doped Al$_{0.25}$Ga$_{0.75}$As layers 706 are formed on the n-Al$_{0.25}$Ga$_{0.75}$As layers 705. The thickness of the respective layers 706 is 125 nm. Since the layers 706 are obtained by the MBE technique without impurity-doping, the Al$_{0.25}$Ga$_{0.75}$As layers 706 becomes of p-type and the doping concentration thereof is $1 \times 10^{15}$ cm$^{-3}$ or less.

Non-doped InGaAs active layers 707 are formed on the non-doped Al$_{0.25}$Ga$_{0.75}$As layers 706. The thickness of the respective layers 707 is 10 nm. The layers 706 is also of p-type and the doping concentration thereof is $1 \times 10^{15}$ cm$^{-3}$ or less. The wavelength of light propagating in the active layers 707 is set so that the wavelength of the light in the atmosphere may be 950 nm.

Non-doped Al$_{0.25}$Ga$_{0.75}$As layers 708 are formed on the non-doped InGaAs active layers 707. The thickness of the respective layers 708 is also 10 nm, similar to the layers 706. The layers 706 are also of p-type and the doping concentration thereof is $1 \times 10^{15}$ cm$^{-3}$ or less.

P-Al$_{0.25}$Ga$_{0.75}$As layers 709 are formed on the non-doped Al$_{0.25}$Ga$_{0.75}$As layers 708. The thickness of the respective layers 709 is 50 Å and the doping concentration thereof is $1 \times 10^{19}$ cm$^{-3}$.

N-GaAs/Al$_{0.4}$Ga$_{0.6}$As layers 710 are formed on the p-Al$_{0.25}$Ga$_{0.75}$As layers 709. The total thickness of the respective layers 710 is approximately 150 nm. The doping concentration thereof is $2\times10^{18}$ cm$^{-3}$. The n-GaAs layer act as a contact with an AuGeNi/Au layers 713 and has a thickness of 50 nm.

A n-DBR layer 711 is formed on the n-GaAs/n-Al$_{0.4}$Ga$_{0.6}$As layer 710 in the PNPN device region, and is not formed in the HBT device region and the HPT device region. The layer 711 is formed by alternately laminated n-AlAs layers and n-GaAs layers (15 periods). The thickness of the film 711 is ($\lambda/4$) ($\lambda$: in-medium wavelength of light).

A dielectric multilayer film 716 is formed on the n-GaAs/n-Al$_{0.4}$Ga$_{0.6}$As layer 710 in the HPT device region. The layer 716 is formed by three TiO$_2$ layers and three SiO$_2$ layers alternately laminated. The total thickness of the film 716 is ($\lambda/4$) ($\lambda$: in-medium wavelength of light).

In the HPT device region on the left side, since the InGaAs active layer 707, which acts as a light absorption layer here, is very thin (thickness: 10 nm), the optical absorption efficiency of the layer 707 will be reduced if the film 716 is not provided. An effective thickness of the film 716 for light absorption can be increased up to approximately 1 $\mu$m due to a resonance effect generated by providing the film 716.

In the PNPN device region on the right side, the AuZn/Au layer 712, which acts as an anode electrode, is formed on an exposed area of the p-GaAs/p-Al$_{0.4}$Ga$_{0.6}$As layer 704.

In the HBT device region and the HBT device region, AuZn/Au layers 712, which act base electrodes, are formed on the n-GaAs/n-Al$_{0.4}$Ga$_{0.6}$As layers 710, respectively.

Besides, in the PNPN device region, an AuGe/Au layer 713, which acts as a cathode electrode, is formed on the n-DBR layer 711 and on an exposed area of the n-GaAs/n-Al$_{0.4}$Ga$_{0.6}$As layer 710. The AuGe/Au layer 713 covers the surface of the n-DBR layer 711 in order to utilize the reflectivity-increasing effect of Au. A reflectivity of approximately 99.9% can be obtained.

In the HBT device region and the HPT device region, AuGe/Au layers 713, which act collector electrodes, are formed on exposed areas of the n-Al$_{0.25}$Ga$_{0.75}$As layers 705, respectively. AuGe/Au layers 713, which act emitter electrodes, are formed on the n-GaAs/n-Al$_{0.4}$Ga$_{0.6}$As layers 710, respectively. In addition, Zn diffusion regions 714 for making the base electrodes are selectively formed in the layers 706 to 710.

In the PNPN device region, proton diffusion regions 717 for current narrowing are selectively formed in the layers 705 to 709. The internal resistance of the PNPN device region can be selectively increased with ensuring a current path in the layer 710.

Proton injection regions 715 for isolation are formed in the p-DBR layer 702 between the three device regions. The bottoms of the regions 715 are extending to the substrate 701.

Diffraction gratings 718 and 719 are formed on a back of the substrate 701, which are disposed just below the HPT device region and the PNPN device region, respectively.

The PNPN device region will perform laser oscillation in the ON-state when a current over the threshold is supplied due to the actions of the p-DBR layer 702 and the n-DBR layer 711. When the ON-state is maintained, the device region will act as a light emitter which emits laser light. When the supply current is maintained below the threshold, the device region will act a light amplifier A supply current from the cathode electrode flows into the n-GaAS/n-Al$_{0.4}$Ga$_{0.6}$As layer 710 without passing through the n-DBR layer 711 in order to avoid a resistance generated in the layer 711.

With the sizes of the device regions, the diameter of the n-DBR layer 711 of the PNPN device region and the diameter of the mesa portion thereof are 10 $\mu$m and 40 $\mu$m, respectively. The sizes of the HPT and HBT regions at the base regions are 30 $\mu$m.

The doping concentrations of the layers 706, 707 and 708 should be $1\times10^{16}$ cm$^{-3}$ or less, and the reason thereof is as follows:

As explained above, if the semiconductor multilayer structure shown in FIG. 9 is formed on the substrate 701 by one crystal growth process and some subsequent processes such as patterning the layers, the three device regions can be obtained on the substrate 701. In this case, the pnpn device region having the set of functions includes ON- and OFF-states. If the doping concentrations of the layers 706, 707 and 708 are not $1\times10^{18}$ cm$^{-3}$ or less, it is difficult for carriers to pass through the InGaAs active layer 707 having a smaller band gap than those of the adjacent non-doped Al$_{0.25}$Ga$_{0.75}$As layers 706 and 708 in the OFF-state, so that transition from the OFF-state to the ON-state cannot be done easily.

Figure 10:
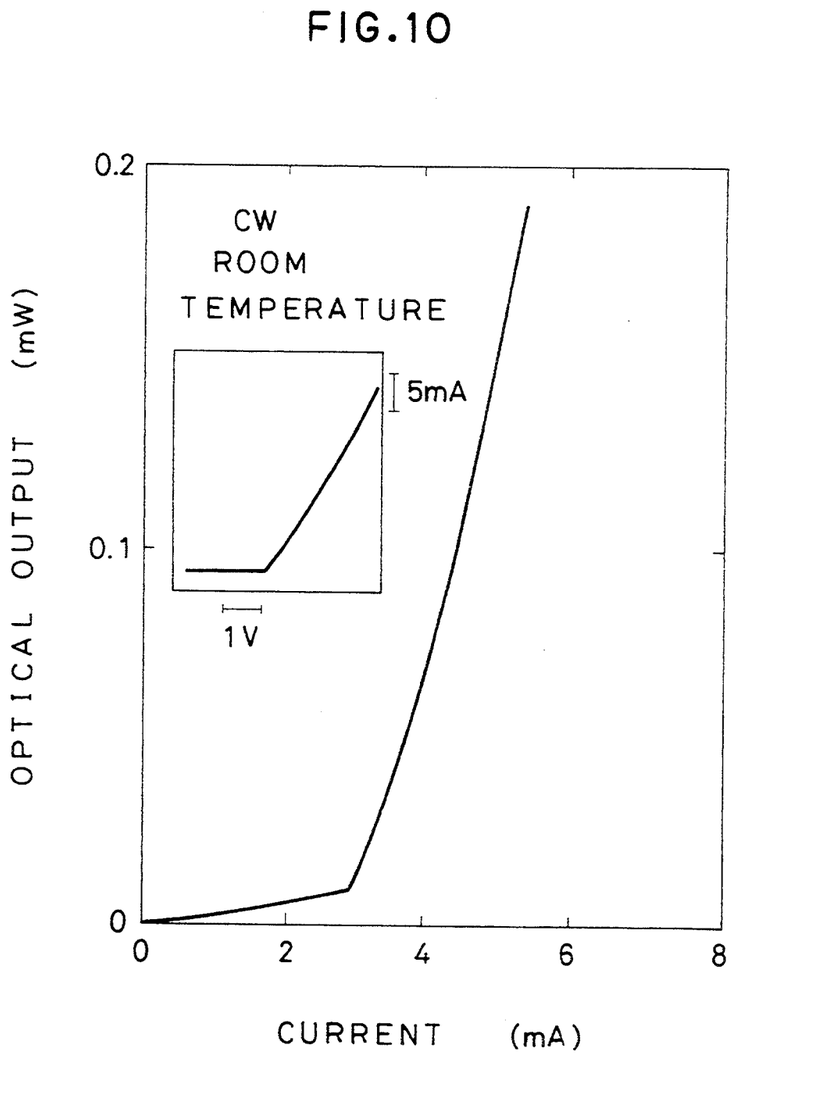
FIG. 10 is a graph showing a relation between a current and an optical output together with a relation between a current and a voltage of a PNPN device in the seventh embodiment.

FIG. 10 shows a characteristic between the supply current and the optical output of the PNPN device region in FIG. 9 together with a characteristic between the supply current and the voltage thereof. In FIG. 10, the switching voltage is approximately 4 V and the threshold current in the ON-state (at continuous operation) is 3 mA.

If the PNPN device region is biased near the switching voltage in the OFF-state, it will switch to the ON-state when light enter the inside of the substrate 701 through the back thereof. The threshold energy of the light is approximately 1 pJ. In addition, if the region is biased 0.98 times current as large as the threshold current in the ON-state, it will act as a light amplifier and realize an optical gain of 15 dB when 1 $\mu$W light is inputted.

If the PNPN device region acts as a light modulator, an extinction ratio between the ON- and OFF-states will be approximately 10 dB in case of light having a wavelength of 950 nm.

In the above embodiments, the semiconductor optical devices are made of GaAs system materials; however, they may be made of any other materials such as InGaAsP system semiconductors.

It is to be understood that the present invention is not limited to the embodiments except as defined in the appended claims.

What is claimed is:

1. A semiconductor optical device comprising:
a semiconductor substrate having a first surface and a second surface opposite to said first surface;
semiconductor device regions formed on said first surface of said semiconductor substrate;
each of said device regions being a semiconductor multilayer structure acting as an optical device; and
diffraction gratings formed on said second surface of said substrate;

each of said diffraction gratings being optically coupled with at least one of said device regions through said substrate;

wherein light propagates through an inside of said substrate so that any one of said device regions is optically coupled with at least one of the remainder of said device regions.

2. The device according to claim 1, wherein one of said respective device regions acts as one of a light emitter, a light receiver, a light modulator and a light amplifier.

3. The device according to claim 1, wherein one of said respective device regions acts as one of a light switch, a memory, a light emitter and a light amplifier selectively.

4. The device according to claim 1, wherein a thickness of said substrate is set so that light propagates through said inside of said substrate and then any of said device regions may be optically coupled with each other.

5. The device according to claim 1, wherein the optical absorption coefficient of said substrate is at most 100 $cm^{-1}$.

6. The device according to claim 1, further comprising at least one second diffractive grating formed on said first surface of said substrate, said at least one second diffractive grating being optically coupled with at least one of said gratings on said second surface of said substrate.

7. The device according to claim 1, wherein each of said device regions has a light modulating function, and wherein said gratings include a first grating having a light dividing function and a second grating having a light combining function, and said first and second gratings being optically coupled with said device regions so that a cross-state and a bar-state of an optical crossbar switch are selectively provided.

8. The device according to claim 1, wherein a first one of said device regions has a light emitting function, a second one of said device regions has a light amplifying function, and a third one of said device regions has a light receiving function, and wherein a light signal emitted from said first one of said device regions is amplified by said second one of said device regions and propagates in said substrate by using said gratings, and then, reaches said third one of said device regions, so that a broadcasting function is provided.

9. The device according to claim 1, further comprising a semiconductor chip having electronic circuits, and said device regions being bonded with said semiconductor chip via solder bumps.

10. The device according to claim 1, wherein said substrate includes an array of said diffraction gratings and an array of said device regions individually associated with said diffraction gratings, each of said device regions emitting a light beam transmitted through its individually associated diffraction grating, and each of said gratings directing said light beams emitted from its individually associated one said device region onto light receiving areas on an external plane which is positioned outside of said substrate;

and wherein when said light beams are emitted from said array of said respective device regions, the diffraction gratings individually associated therewith direct said light beams toward corresponding light receiving areas on said external plane to irradiate respective ones of said light receiving areas, said receiving areas being larger than corresponding areas which said device regions occupy on said first surface of said substrate thereby enlarging an image on said external plane of said light emitted by said device regions.

11. The device according to claim 10, wherein said substrate including said array of said diffraction gratings and said array of said device regions are mounted on a semiconductor chip via solder bumps, said semiconductor chip having electronic circuits which produce electronic signals, and wherein said light beams are obtained by converting said electric signals from said electronic circuits in said device regions, and said emitted light beams being converged on said external plane.

12. The device according to claim 1, further comprising a dielectric film formed on said second surface of said substrate;

said film acting as a light propagation layer and having second diffraction gratings; and a thickness of said dielectric film being such that each of said second diffraction gratings on said dielectric film is optically coupled with at least one of said diffraction gratings formed on said second surface of said substrate.

13. The device according to claim 12, wherein said dielectric film is made of at least one of SiN, $SiO_2$ and $TiO_2$.

14. The device according to claim 1, wherein said substrate is a semi-insulating semiconductor;

said device regions having a multilayer structure are formed by a p-type first distributed Bragg reflector layer, a p-type first semiconductor layer, an n-type second semiconductor layer, a third semiconductor layer of low impurity concentration, a p-type fourth semiconductor layer, an n-type fifth semiconductor layer, and an n-type second distributed Bragg reflector layer, which are laminated on said first surface of said substrate in this order;

said third semiconductor layer includes a semiconductor active layer of the same conductive type which serves as a light absorption layer; and said device regions each acting as an optical device are composed of said n-type second semiconductor layer, said third semiconductor layer having a low impurity concentration, the p-type fourth semiconductor layer and said n-type fifth semiconductor layer.

15. The device according to claim 1, wherein an output light beam is emitted from said substrate in a direction substantially perpendicular to said second surface of said substrate.

16. The device according to claim 14, wherein an output light beam is emitted from said substrate in a direction substantially perpendicular to said second surface of said substrate.

17. A semiconductor optical device comprising:

a semiconductor substrate having a first surface and a second surface opposite to said first surface;

semiconductor device regions formed on said first surface of said semiconductor substrate;

each of said device regions being a semiconductor multilayer structure and acting as an optical device;

one of said device regions having a light emitting function;

diffraction gratings formed on said second surface of said substrate; and each of said diffraction gratings being optically coupled with at least one of said device regions via said substrate;

light propagating through an inside of said substrate so that any one of said device regions is optically coupled with at least one of the remainder of said device regions;

and light generated by said one of said device regions having a light emitting function is emitted as an output light beam from said substrate through one of said diffraction gratings in a direction substantially perpendicular to said second surface of said substrate.

18. The device according to either claim 14 or claim 15, wherein said impurity concentration of the third semiconductor layer is at most $1 \times 10^{16}$ cm$^{-3}$, and a band gap of said active semiconductor layer is set so as to be narrower than those of said adjacent semiconductor layers.

19. The device according to either claim 14 or claim 15, wherein said second distributed Bragg reflector layer is selectively removed, and said device regions act as at least one of a light receiver and a light modulator are composed of said second, third, fourth and fifth layers.

20. The device according to either claim 14 or claim 15, wherein said first distributed Bragg reflector layer is selectively removed, and an isolation region extending to said substrate is formed at said removed portion.

21. The device according to either claim 14 or claim 15, wherein at least one of said device regions has a light receiver function which acts as a bipolar transistor.

15. A semiconductor optical device comprising:
a semiconductor substrate, said substrate being a semi-insulating semiconductor;

semiconductor device regions formed on a first surface of said semiconductor substrate, each of said device regions being a multilayer structure which acts as at least one optical device respectively;

diffraction gratings formed on a second surface of said substrate opposite said first surface, said diffraction gratings being optically coupled with said device regions through said substrate;

said device regions having said multilayer structure being formed by a p-type first distributed Bragg reflector layer, a p-type first semiconductor layer, an n-type second semiconductor layer, a third semiconductor layer of low impurity concentration, a p-type fourth semiconductor layer, an n-type fifth semiconductor layer, and an n-type second distributed Bragg reflector layer, which are laminated on said first surface of said substrate in the named order;

said third semiconductor layer including a semiconductor active layer of the same conductive type which serves as a light absorption layer; and each of said device regions acting as an optical device and being composed of said n-type second semiconductor layer, said third semiconductor layer having a low impurity concentration, the p-type fourth semiconductor layer, and said n-type fifth semiconductor layer.

23. The semiconductor optical device of claim 1 wherein a plurality of said diffraction gratings are formed on said first surface and between said device regions.

24. The semiconductor optical device of claim 1 further comprising a semiconductor chip bonded to said device regions via solder bumps, said bonding being made by a flip-chip bonding technique.

25. The semiconductor optical device of claim 24 wherein said semiconductor chip is an integrated circuit device.

26. The semiconductor optical device of claim 24 further comprising a second semiconductor substrate having a plurality of light receiving regions formed on a first surface, and means for supporting said semiconductor substrate and said second semiconductor substrate in a spaced parallel relationship, said device regions emitting light, said supporting means holding said semiconductor substrate and said second semiconductor device so that said light emitted from said device regions falls on individually associated ones of said light receiving regions.

27. The semiconductor device of claim 26 wherein said second semiconductor substrate is an integrated circuit device.

28. The semiconductor of claim 27 further comprising a silicon oxide film attached to the second surface of said semiconductor substrate and covering said diffraction gratings, said film having a side opposite said diffraction gratings, said opposite side having second diffraction gratings thereon, said second diffraction gratings being off-set from said diffraction gratings on said semiconductor substrate.

29. The semiconductor of claim 24 wherein at least one of said device regions is a PNPN switch.

* * * * *